United States Patent
Takahashi et al.

(10) Patent No.: US 11,389,911 B2
(45) Date of Patent: Jul. 19, 2022

(54) METHOD OF MANUFACTURING HEAT SINK AND HEAT SINK

(71) Applicant: NAKAMURA MFG. CO., LTD., Nagano (JP)

(72) Inventors: Keiichi Takahashi, Nagano (JP); Kazuto Arai, Nagano (JP)

(73) Assignee: NAKAMURA MFG. CO., LTD., Nagano (JP)

( * ) Notice: Subject to any disclaimer, the term of this patent is extended or adjusted under 35 U.S.C. 154(b) by 0 days.

(21) Appl. No.: 17/061,467

(22) Filed: Oct. 1, 2020

(65) Prior Publication Data

US 2021/0138592 A1 May 13, 2021

(30) Foreign Application Priority Data

Nov. 13, 2019 (JP) .............................. JP2019-205793

(51) Int. Cl.
*B23P 15/26* (2006.01)
*H05K 7/20* (2006.01)
*B21J 5/06* (2006.01)
*B21D 53/02* (2006.01)

(52) U.S. Cl.
CPC ............ *B23P 15/26* (2013.01); *H05K 7/2039* (2013.01); *B21D 53/022* (2013.01); *B21J 5/068* (2020.08); *B23P 2700/10* (2013.01)

(58) Field of Classification Search
CPC ..... B21J 5/068; B21D 53/022; B23P 2700/10
See application file for complete search history.

(56) References Cited

U.S. PATENT DOCUMENTS

| | | | | |
|---|---|---|---|---|
| 3,692,105 A | * | 9/1972 | O'Connor | B21C 37/205 165/181 |
| 3,746,086 A | * | 7/1973 | Pasternak | B21D 53/02 165/181 |
| 3,850,236 A | * | 11/1974 | O'Connor | F28F 1/26 165/181 |
| 3,886,639 A | * | 6/1975 | Pasternak | B21J 5/068 165/181 |
| 3,901,312 A | * | 8/1975 | Pasternak | F28F 1/26 165/181 |

(Continued)

FOREIGN PATENT DOCUMENTS

JP H06232300 A 8/1994
JP H11168160 A 6/1999

*Primary Examiner* — Jason L Vaughan
(74) *Attorney, Agent, or Firm* — Hauptman Ham, LLP

(57) ABSTRACT

A method of manufacturing a heat sink includes a rib portion forming step of forming a rib portion on a substrate having a flat plate shape in such a manner that a first groove and a second groove are formed on a front surface side of the substrate by plastically deforming the substrate by a press thus forming the rib portion in a region sandwiched between the first groove and the second groove. The method further includes a back surface protruding ridge portion cutting removal step of removing protruding ridge portions formed on a back surface side of the substrate by cutting. The method further includes a fin forming step of forming a plurality of fins by working the rib portion; and a heat sink separating step of obtaining the heat sink by separating a portion within a predetermined range which includes the fins from the substrate.

4 Claims, 8 Drawing Sheets

(56) References Cited

U.S. PATENT DOCUMENTS

| | | | | |
|---|---|---|---|---|
| 3,947,941 A * | 4/1976 | O'Connor | ................ | B21J 5/068 |
| | | | | 165/181 |
| 4,203,311 A * | 5/1980 | O'Connor | ................ | B21C 37/20 |
| | | | | 72/368 |
| 4,369,838 A * | 1/1983 | Asanuma | ............ | H01L 23/4006 |
| | | | | 257/722 |
| 6,339,880 B1 * | 1/2002 | Ohta | ................... | H01L 23/3736 |
| | | | | 257/E23.109 |
| 6,341,651 B1 * | 1/2002 | Ohta | ....................... | B23P 15/26 |
| | | | | 165/181 |
| 6,349,762 B2 * | 2/2002 | Ohta | ................... | H01L 23/3672 |
| | | | | 257/722 |
| 7,320,177 B2 * | 1/2008 | Miyahara | .................. | F28F 3/04 |
| | | | | 257/E23.103 |
| 7,969,740 B2 * | 6/2011 | Miyahara | ................. | B21J 5/068 |
| | | | | 428/615 |
| 8,387,247 B2 * | 3/2013 | Miyahara | ............ | H01L 21/4878 |
| | | | | 72/332 |
| 8,702,359 B2 * | 4/2014 | Miyahara | ................. | B23D 5/00 |
| | | | | 409/293 |
| 2001/0030039 A1 * | 10/2001 | Copeland | ............. | F28F 21/084 |
| | | | | 165/185 |
| 2002/189790 A1 * | 12/2002 | Wong | ...................... | B23P 15/26 |
| | | | | 165/905 |
| 2005/0229389 A1 * | 10/2005 | Chen | ................... | H01L 21/4878 |
| | | | | 29/726 |

\* cited by examiner

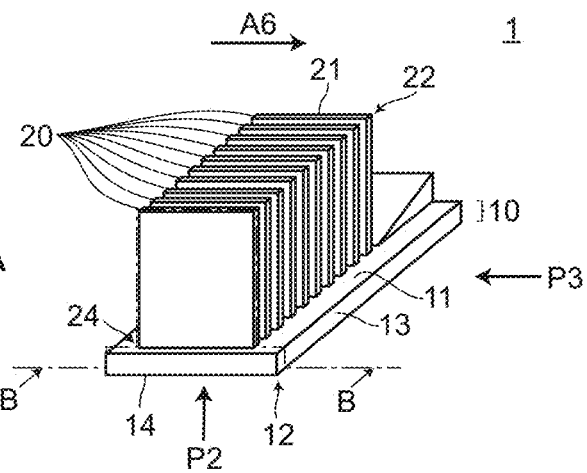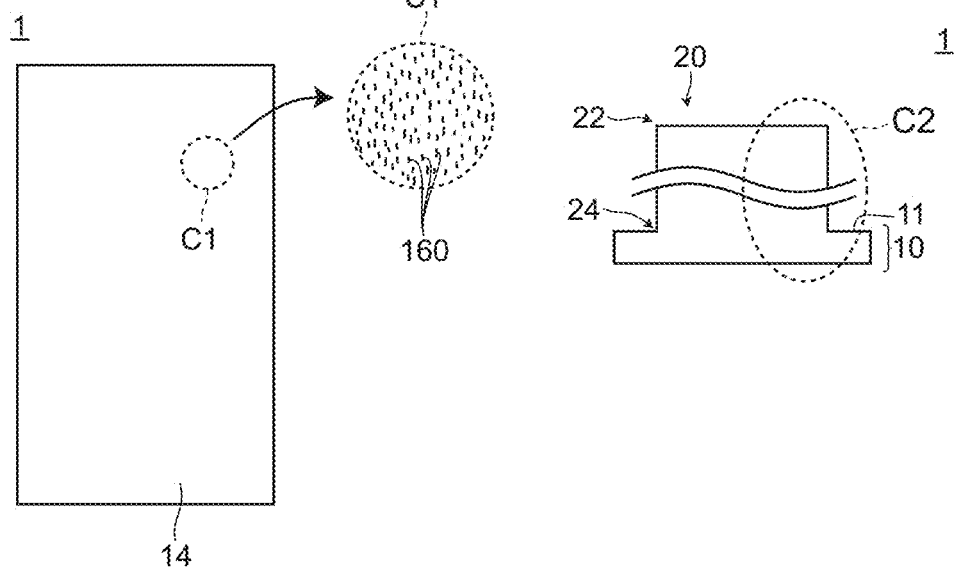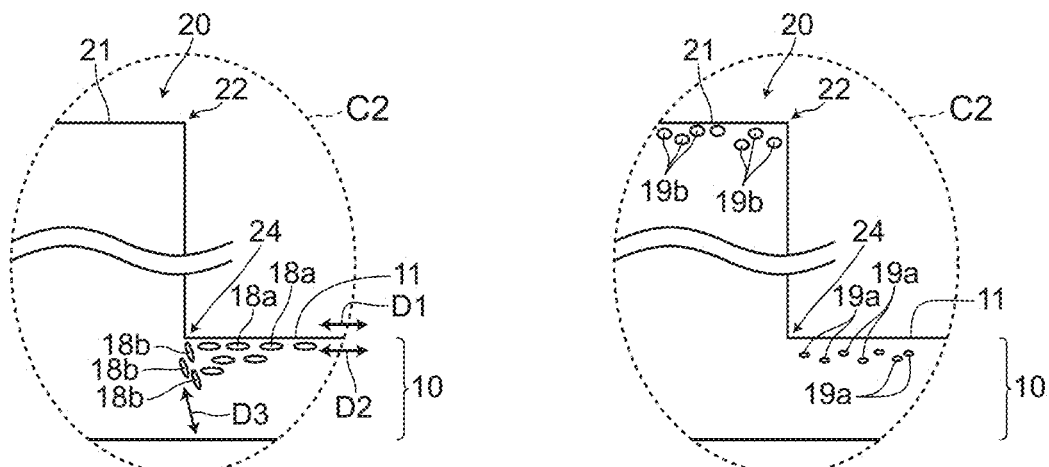

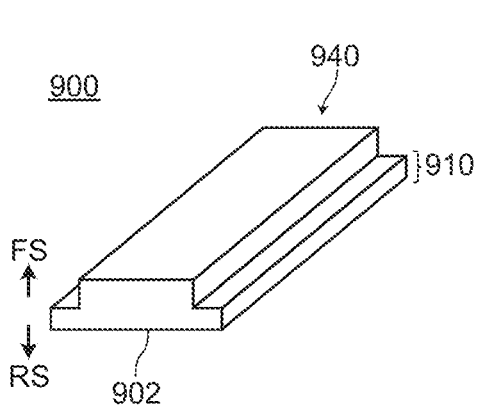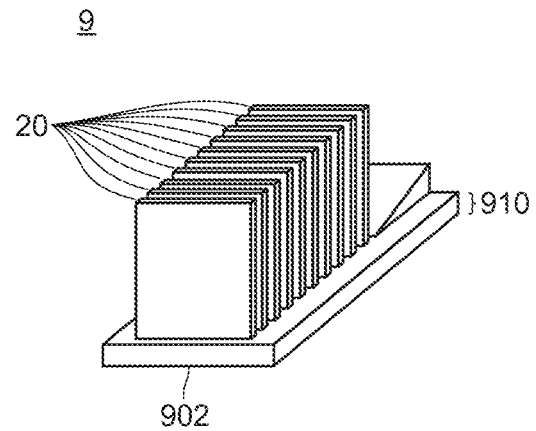
FIG.8A PRIOR ART
FIG.8B PRIOR ART

METHOD OF MANUFACTURING HEAT SINK AND HEAT SINK

RELATED APPLICATIONS

The present application claims priority to Japanese Application Number 2019-205793 filed Nov. 13, 2019, the disclosure of which is hereby incorporated by reference herein in its entirety.

BACKGROUND OF THE INVENTION

Field of the Invention

The present invention relates to a method of manufacturing a heat sink and a heat sink.

Description of the Related Art

Conventionally, a heat sink has been known as a means for radiating heat generated by an electronic part, electronic equipment or the like. FIG. 8 is a view provided for describing a conventional heat sink. FIG. 8A is a perspective view showing a substrate 900 having a strip shape, and FIG. 8B is a perspective view showing a heat sink 9 manufactured using the substrate 900 having a strip shape.

As shown in FIG. 8B, a large number of thin fins 20 are formed on a surface of the heat sink 9 for enhancing heat radiation efficiency. The fins 20 can be formed, for example, such that the fins 20 are erected from a side of a heat sink base portion 910 by shaving a rib portion 940 (see FIG. 8A) of the substrate 900 having a strip shape by skiving (see JP 6-232300 A and JP 11-168160 A, for example).

SUMMARY OF THE INVENTION

The substrate 900 having a strip shape shown in FIG. 8A which is formed of the base portion (heat sink base portion) 910 and the rib portion 940 can be obtained by extrusion molding, for example (see JP 6-232300 A).

However, in general, in performing extrusion molding using metal, a weight of a material used per one lot is enormous. For example, a material having a weight of an order of tons is used usually. Accordingly, in the adjustment of the number of manufactured heat sinks, it is necessary to increase or decrease the number of manufactured heat sinks at the order of tons. Accordingly, when such an extrusion molding method is adopted in the manufacture of relatively small heat sinks, the number of manufactured heat sinks becomes excessively large and, eventually, a manufacturing cost is pushed up.

It has been considered that, although extrusion molding is desired for a case where a material used in extrusion molding is an aluminum material, extrusion molding is not desired for a case where a material used in extrusion molding is a copper material because of many technical problems the extrusion molding faces. A copper material has higher heat conductivity than an aluminum material and hence, a copper material has been recently attracting attention as a promising material for manufacturing heat sinks. However, it is a matter for regret that, due to several conditions including the above-mentioned condition, a method of obtaining a substrate 900 having a strip shape made of a copper material by extrusion molding has not been named as a realistic choice.

On the other hand, a method of obtaining a substrate 900 having a strip shape by cutting working has been studied. That is, the substrate 900 having a strip shape can be obtained by cutting undesired portions of the substrate 900 having a strip shape from a front surface side FS of a substrate having a flat plate shape (not shown in the drawing).

However, the method of obtaining the substrate 900 having a strip shape by cutting working requires a long working time and hence, a time cycle is elongated whereby the improvement of productivity cannot be expected and, eventually, a manufacturing cost is pushed up.

The present invention has been made in view of the above-mentioned circumstances, and it is an object of the present invention to provide a method of manufacturing a heat sink which also enables the manufacture of the heat sink using a copper material, can easily adjust the number of manufactured heat sinks compared to the prior art, and can suppress a manufacturing cost. It is another object of the present invention to provide a heat sink which can be manufactured relatively inexpensively, and yet possesses high heat radiation efficiency.

[1] According to an aspect of the present invention, there is provided a method of manufacturing a heat sink made of metal, wherein the method includes in a following order: a rib portion forming step of forming a rib portion on a substrate having a flat plate shape in such a manner that a first groove and a second groove are formed on a front surface side of the substrate by plastically deforming the substrate by a press thus forming the rib portion in a region sandwiched between the first groove and the second groove; a back surface protruding ridge portion cutting removal step of removing protruding ridge portions formed on a back surface side of the substrate by cutting; a fin forming step of forming a plurality of fins by working the rib portion; and a heat sink separating step of obtaining the heat sink by separating a portion within a predetermined range which includes the fins from the substrate.

[2] According to a preferred mode of the method of manufacturing a heat sink of the present invention, in the fin forming step, the fins are formed by shaving and raising the rib portion by skiving.

[3] According to a preferred mode of the method of manufacturing a heat sink of the present invention, a width of the first groove, a width of the rib portion and a width of the second groove are relatively set such that a sum of the width of the first groove, the width of the rib portion and the width of the second groove is larger than a width of a blade used in performing the working in the fin forming step.

[4] According to a preferred mode of the method of manufacturing a heat sink of the present invention, the method further includes a third groove forming step between the rib portion forming step and the heat sink separating step, wherein in the third groove forming step, a third groove is formed on a bottom surface of at least one groove out of the first groove and the second groove at a position outside a position at which an end of a heat sink base portion is scheduled to be formed.

[5] According to a first aspect of the present invention, there is provided a heat sink made of metal, wherein the heat sink includes, on a front surface side of the heat sink, a heat sink base portion which is a base portion for fins, and a plurality of the fins formed in a raised manner from a side of the heat sink base portion.

In such a configuration, a surface worked trace is formed on a back surface of the heat sink by removing a protruding portion by cutting and by adjusting a cut surface, Assuming that the heat sink base portion and the fins are cut on a plane which is perpendicular to the back surface of the heat sink and parallel to a width direction of the fins, and the cut surface is observed by a microscope, a direction of lines relating to a metal structure right below an upper surface of the heat sink base portion is approximately parallel to the upper surface of the heat sink base portion, and a direction of lines relating to a metal structure right below proximal ends of the fins intersects with a direction parallel to the upper surface of the heat sink base portion, and the lines relating to the metal structure converge toward an area in a vicinity of the proximal ends of the fins.

As a preferred mode of the present invention, the heat sink may be made of copper.

[6] According to a second aspect of the present invention, there is provided a heat sink made of metal, wherein the heat sink includes, on a front surface side of the heat sink, a heat sink base portion which is a base portion for fins, and a plurality of the fins formed in a raised manner from a side of the heat sink base portion.

In such a configuration, a surface worked trace is formed on a back surface of the heat sink by removing a protruding portion by cutting and by adjusting a cut surface.

Assuming that the heat sink base portion and the fins are cut on a plane which is perpendicular to the back surface of the heat sink and parallel to a width direction of the fins, and the cut surface is observed by a microscope, an average particle size of a grain boundary of a metal structure right below an upper surface of the heat sink base portion is smaller than an average particle size of a grain boundary of a metal structure at a position disposed at a predetermined depth in a vicinity of distal ends of the fins.

As a preferred mode of the present invention, the heat sink may be made of copper.

[7] According to a third aspect of the present invention, there is provided a heat sink obtained by forming a first groove and a second groove on a front surface side of a substrate by plastically deforming the substrate made of metal and having a flat plate shape by a press, forming a rib portion in a region sandwiched between the first groove and the second groove, and by removing protruding ridge portions formed on a back surface side of the substrate by cutting, forming a plurality of fins at positions corresponding to the rib portion, and separating a portion within a predetermined range from the substrate.

As a preferred aspect of the heat sink, the plurality of fins may be formed by shaving and raising the rib portion by skiving. Further, as a preferred aspect of the heat sink, heat sink may be made of a copper.

According to the method of manufacturing a heat sink according to the present invention, the heat sink can be manufactured using a copper material, the number of manufactured heat sinks can be easily adjusted compared to the prior art, and can suppress a manufacturing cost. Further, according to the heat sink of the present invention, a user can acquire a heat sink which is relatively inexpensive and exhibits high heat radiation efficiency.

BRIEF DESCRIPTION OF THE DRAWINGS

FIGS. 4A-E are views for describing a heat sink 1 according to the embodiment 1;

FIGS. 8A and 8B are views for describing a conventional heat sink, wherein symbol 902 indicates a back surface of a substrate 900 having a strip shape, and symbol FS indicates the same back surface side of the substrate 900 having a strip shape.

DETAILED DESCRIPTION OF THE PREFERRED EMBODIMENTS

Hereinafter, a heat exchanger according to the present invention is described with reference to drawings. The respective drawings are schematics views showing one example, and do not always strictly reflect actual sizes, ratios and the like of the heat exchanger.

Embodiment 1

1. Method of Manufacturing Heat Sink According to Embodiment 1
(1) Summary of Method of Manufacturing Heat Sink
FIG. 1 is a flowchart for describing a method of manufacturing a heat sink according to an embodiment 1.

Figure 1:
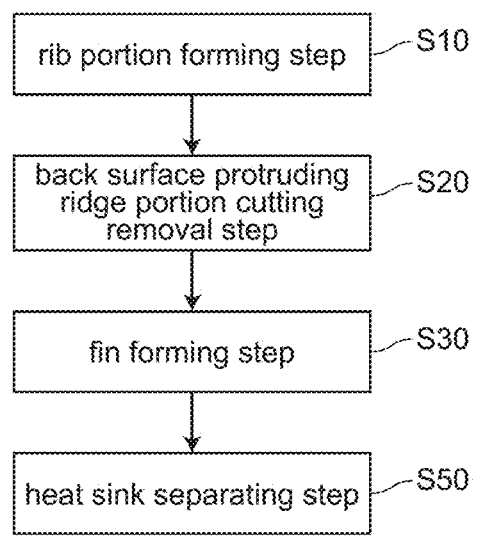
FIG. 1 is a flowchart for describing a method of manufacturing a heat sink according to an embodiment 1.

As shown in FIG. 1, the method of manufacturing a heat sink according to the embodiment 1 is a method of manufacturing a heat sink made of metal, and includes at least a rib portion forming step S10, a back surface protruding ridge portion cutting removal step S20, a fin forming step S30, and a heat sink separating step S50 in this order. Hereinafter, the respective steps are described with reference to FIGS. 2A-H and FIGS. 3A-F in this order.

(2) Detailed Configuration of Method of Manufacturing Heat Sink

Figure 2A:
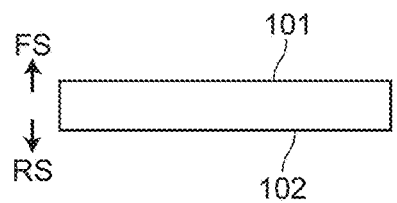
FIGS. 2A-H are views for describing a rib portion forming step S10 and a back surface protruding ridge porting cutting removal step S20 in the method of manufacturing a heat sink according to the embodiment 1.
Figure 2B:
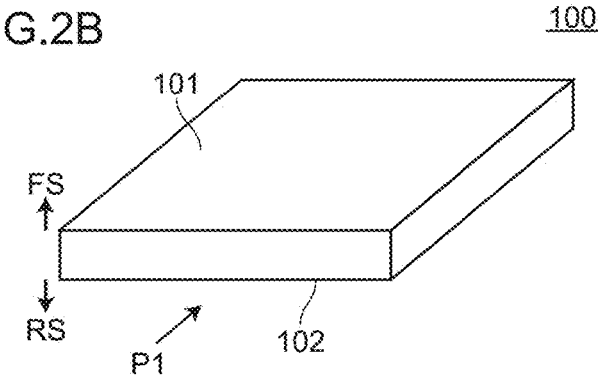
Figure 2C:
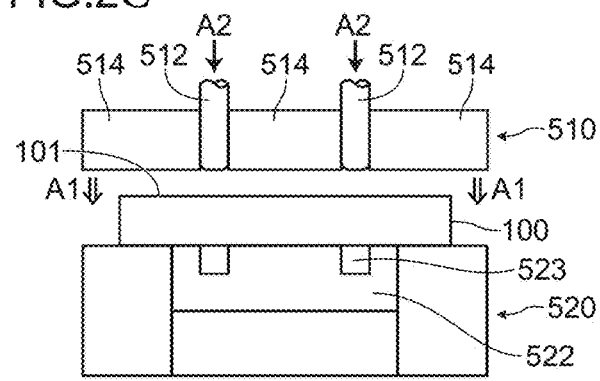
Figure 2D:
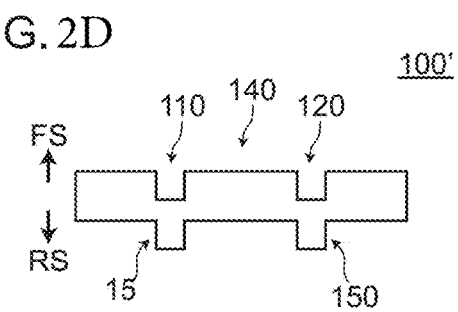
Figure 2E:
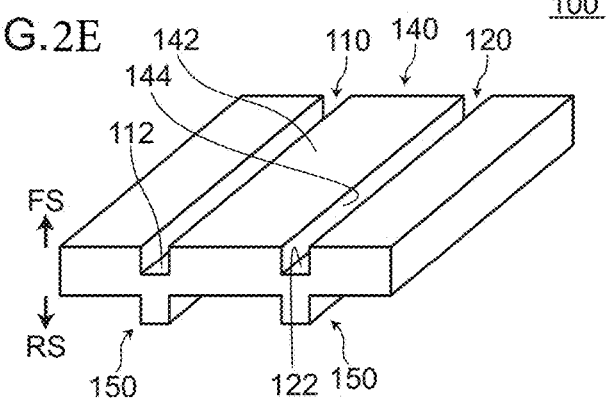
Figure 2F:
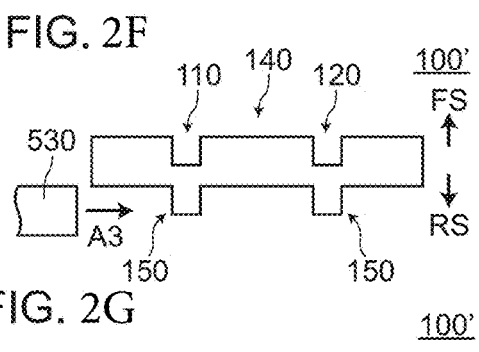
Figure 2G:
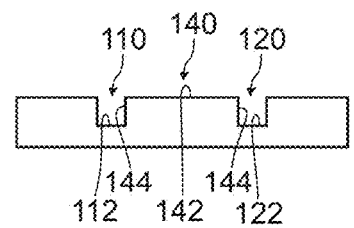
Figure 2H:
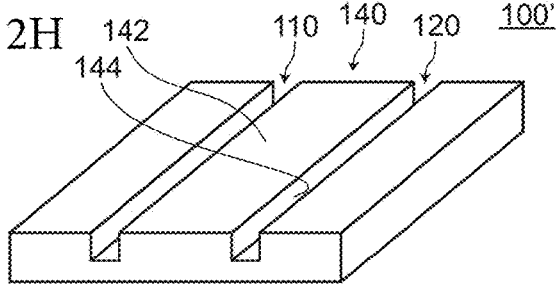

FIGS. 2A-H are views for describing the rib portion forming step S10 and the back surface protruding ridge portion cutting removal step S20 in the method of manufacturing a heat sink according to the embodiment 1. FIG. 2A, FIG. 2C, FIG. 2D, FIG. 2F, and FIG. 2G are front views or cross-sectional views, and FIG. 2B, FIG. 2E, and FIG. 2H are perspective views respectively corresponding to FIG. 2A, FIG. 2D, and FIG. 2G. For example, FIG. 2B is a perspective view showing a state where a substrate 100 having a flat plate shape is prepared, and FIG. 2A is a front view of the substrate 100 as viewed along an arrow P1 in FIG. 2B. The method of manufacturing a heat sink according to the embodiment 1 is illustrated in accordance with the substantially same relationship hereinafter.

Figure 3A:
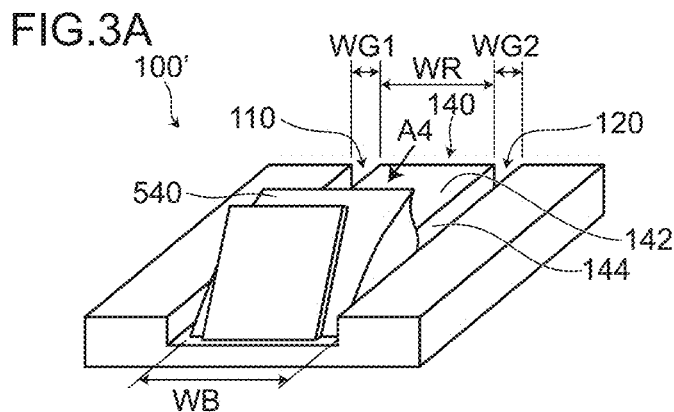
FIGS. 3A-F are views for describing a fin forming step S30 and a heat sink separating step S50 in the method of manufacturing a heat sink according to the embodiment 1.
Figure 3B:
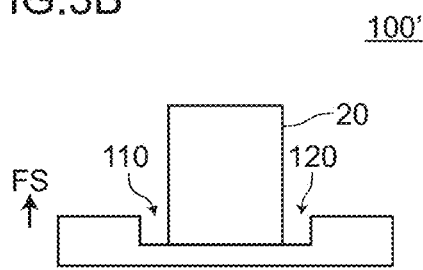
Figure 3C:
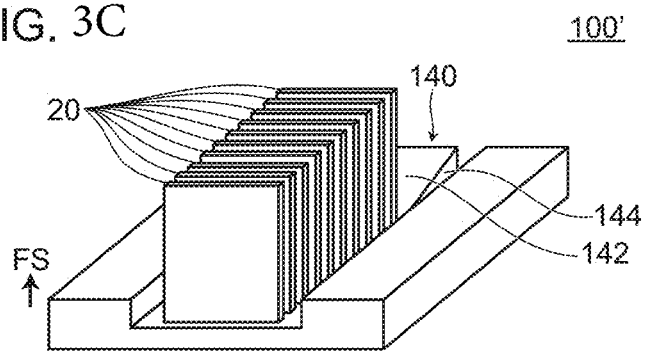
Figure 3D:
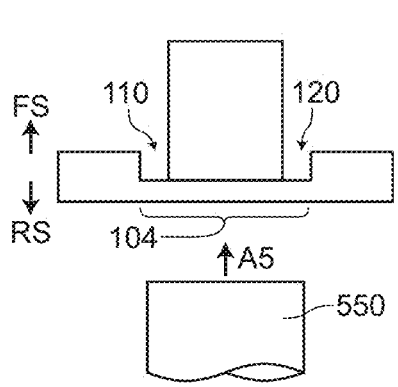
Figure 3E:
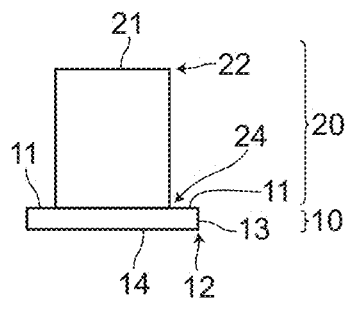
Figure 3F:
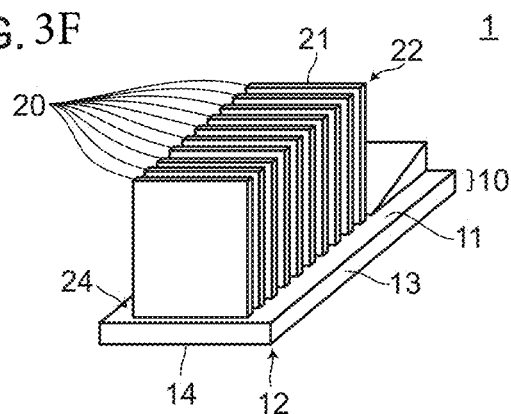

FIGS. 3A-F are views for describing the fin forming step S30 and the heat sink separating step S50 of the method of manufacturing a heat sink according to the embodiment 1. FIG. 3B, FIG. D, and FIG. 3E are front views, and FIG. C and FIG. 3F are perspective views respectively corresponding to FIG. 3B, and FIG. 3E. FIG. 3A is a perspective view showing the fin forming step S30 (a front view corresponding to the perspective view not shown in the drawing).

(i) Substrate Having a Flat Plate Shape

Before performing the rib portion forming step S10, the substrate 100 having a flat plate shape shown in FIG. FIG. 2A and FIG. 2B is prepared. The substrate 100 having a flat plate shape is a flat-plate-like material having an approximately fixed thickness. In this embodiment, as the material which is metal, for example, a material such as metal containing aluminum, or metal containing copper can be adopted. As the substrate 100 having a flat plate shape, a rolled material can be adopted.

In this specification, assume a surface of the substrate 100, 100' having a flat plate shape on a side where fins 20 are formed in the fin forming step S30 (described in detail later) as "front surface 101" of the substrate 100, 100', and assume a surface of the substrate 100, 100' having a flat plate shape on a side opposite to the front surface 101 as "back surface 102". Further, assume a side of the front surface 101 as "front surface side FS" and assume a side of the back surface 102 as "back surface side RS".

(ii) Rib Portion Forming Step S10

In the rib portion forming step S10, a first groove 110 and a second groove 120 are formed on the front surface side FS of the substrate 100 having a flat plate shape by plastically deforming the substrate 100 by a press and hence, a rib portion 140 is formed in a region sandwiched by the first groove 110 and the second groove 120.

In the description made hereinafter, a substrate which is obtained by working only a part of the substrate 100 having a flat plate shape is indicated by symbol 100'.

Working adopted in the rib forming step S10 is performed by plastic deformation without adopting cutting removal which is performed by cutting working.

For example, the rib portion forming step S10 may be performed using a press device which includes an upper mold 510 and a lower mold 520 as shown in FIG. 2C. The substrate 100 having a flat plate shape is disposed between the upper mold 510 and the lower mold 520, and the substrate 100 is pressed by making punches 512 apply an impact to the front surface 101 of the substrate 100 along a direction indicated by an arrow A2 in a state where the substrate 100 is pressed in a direction indicated by an arrow A1 by a press plate 514. The lower mold 520 includes a die 522 in which cavities 523 are formed corresponding to positions at which the punches 512 are disposed. Volume portions which are portions of the material are retracted toward the back surface side RS of the substrate 100 when the punches 512 apply an impact to the substrate 100.

The plastic deformation by the press in this step is performed for forming grooves on the front surface side FS of the substrate 100 having a depth which reaches an intermediate position of a plate thickness of the substrate 100. That is, the plastic deformation is not complete blanking, and is pressing referred to as "half pressing" or "half cutting working". The first groove 110 and the second groove 120 are formed by performing such pressing. Along with the formation of the first groove 110 and the second groove 120, the rib portion 140 is formed in the region sandwiched by the first groove 110 and the second groove 120. By suitably designing the punches 512 and the cavities 523, the first groove 110 and the second groove 120 can have a predetermined length and, as a result, the rib portion 140 becomes an elongated portion having a predetermined length. In this embodiment, "length" of the groove is a length along a direction perpendicular to a surface of paper on which in FIG. 2C, for example. Along with the formation of the grooves, protruding ridge portions 150 having a shape which traces an inner side shape of the cavity 523 are formed on the back surface side RS of the substrate 100' (see FIG. 2D and FIG. 2E).

Side surfaces 144 of the rib portion 140 are mainly formed of shearing surfaces generated by a press. A bottom surface 112 of the first groove 110 (a portion of the bottom surface 112 forming an upper surface 11 of the heat sink base portion 10 described later) and a depth portion just below the bottom surface 112, as well as, a bottom surface 122 of the second groove 120 (a portion of the bottom surface 122 forming the upper surface 11 of the heat sink based portion 10 described later) and a depth portion just below the bottom surface 122 are formed into a metal structure which is further compressed compared to the prior art by an impact generated by the punches 512. On the other hand, a top surface of the rib portion 140 does not receive an impact of the punches 512 and hence, a state of the metal structure is maintained equal to a state before such pressing.

Although an impact of pressing may be applied one time, an impact of pressing may be applied plural times in batches.

It is desirable that the bottom surface 112 of the first groove 110 and the bottom surface 122 of the second groove 120 be formed of a flat surface. When a user of a product (heat sink 1) seals a cooling medium in the product, sealing members not shown in the drawing can be brought into contact with the flat-surface-like bottom surfaces 112, 122 and hence, sealing with no leakage can be easily realized.

(iii) Back Surface Protruding Ridge Portion Cutting Removal Step S20

In the back surface protruding ridge portion cutting removal step S20, for example, protruding ridge portions 150 formed on the back surface side RS of the substrate 100' are removed by cutting using a cutting tool 530 (for example, an endmill). Then, a shape of the back surface side RS of the substrate 100' is formed into a surface shape which satisfies a specification requested by a client while removing the protruding ridge portions 150.

In the back surface protruding ridge portion cutting removal step S20, at least the protruding ridge portions 150 are removed by cutting. However, a portion of the substrate 100' having a predetermined plate thickness may be also shaved.

By performing the rib portion forming step S10 and the back surface protruding ridge portion cutting removal step S20 as described above, it is possible to obtain a material having a shape which is partially similar to a shape of the conventional substrate 900 having a strip shape (see FIG. 2G and FIG. 2H).

(iv) Fin Forming Step S30

In the fin forming step S30, the plurality of fins 20 are formed by working the rib portion 140 (see FIG. 3B and FIG. 3C).

A desired working method can be adopted as a working method of forming the fins 20.

For example, as shown in FIG. 3A, the fins 20 may be formed such that a cutting tool 540 is brought into contact with the rib portion 140, the cutting tool 540 is moved in a direction indicated by an arrow A4, and the rib portion 140 is shaved and raised thus forming the fins 20. Skiving can be introduced into the fin forming step S30 by referencing a technique described in JP 11-168160 A or the like and hence, the description of these documents can be used as the detailed explanation of the skiving.

In the fin forming step S30, it is desirable that a width WG1 of the first groove 110, a width WR of the rib portion 140 and a width WG2 of the second groove 120 be relatively set such that a sum of the width WG1 of the first groove 110, the width WR of the rib portion 140 and the width WG2 of the second groove 120 is larger than a width WB of the blade 540 used in performing working in the fin forming step S30. In this embodiment, the respective widths WG1, WR, WG2, WB indicate widths when the first groove 110, the rib portion 140, the second groove 120 and the blade (cutting tool) 540 are respectively viewed along a longitudinal direction of the first groove 110 and the second groove 120.

The shape of the fin can be formed into a desired shape which conforms to a specification requested by a client. For example, with respect to the fin 20 shown in FIG. 3B and FIG. 3C, a straight planar fin is adopted.

(v) Heat Sink Separating Step S50

In the heat sink separating step S50, the heat sink 1 is obtained by separating a part 104 of the substrate 100' within a predetermined range which includes the fins 20 from the substrate 100'. In this step, "the part 104 of the substrate 100' within a predetermined range which includes the fins 20" is a part which becomes the heat sink 1 when the part is separated (see FIG. 3D).

As a working method of separating the heat sink 1, a desired working method can be adopted.

For example, as shown in FIG. 3D, the heat sink 1 may be separated by blanking the part 104 within the predetermined range in a direction indicated by an arrow A5 by a punch 550 (profile blanking).

As has been describe above, the heat sink 1 described in FIG. 3E and FIG. 3F can be obtained by performing the rib portion forming step S10, the back surface protruding ridge portion cutting removal step S20, the fin forming step S30 and the heat sink separating step S50. The configuration of the obtained heat sink 1 is described in the following chapter and hence, the description of the configuration of the heat sink 1 is omitted.

2. Advantageous Effects Acquired by Method of Manufacturing Heat Sink According to Embodiment 1

(1) The manufacturing method according to embodiment 1 is a method where the first groove 110 and the second groove 120 are formed on the front surface side of the substrate 100 having a flat plate shape by plastically deforming the substrate 100 by a press and hence, the rib portion 140 is formed in the region sandwiched by the first groove 110 and the second groove 120. Accordingly, the manufacturing method according to the embodiment 1 is a method which does not use extrusion molding and hence, the manufacture of a heat sink using a copper material can be also realized. Further, it is sufficient to work a desired number of substrates each having a flat plate shape 100 and hence, it is not necessary to excessively manufacture heat sinks unlike extrusion molding and hence, the number of manufactured heat sinks can be easily adjusted compared to the prior art, and there is no possibility that a product cost becomes excessively high (due to the above-mentioned excessive manufacture of heat sinks). Further, the manufacturing method according to the embodiment 1 is a method which makes use of plastic deformation by a press and hence, a working time becomes short compared to cutting working and hence, productivity can be enhanced and a manufacturing cost can be suppressed. Further, a rolled material or the like which is commercially available in a general market, for example, can be used for forming the substrate 100 having a flat plate shape and hence, a cost can be also suppressed compared to extrusion molding.

As has been described above, according to the method of manufacturing a heat sink according to the embodiment 1, the manufacture of heat sinks using a copper material can be also realized, a production amount can be easily adjusted compared to the prior art and a manufacturing cost can be suppressed.

(2) In the fin forming step S30, the fins 20 are formed by shaving and raising the rib portion 140 by skiving. By adopting such skiving, it is possible to form the thin fins (fins each having a thin wall thickness) which exhibit high heat radiation efficiency. Further, cutting chips are minimally produced in skiving and hence, material use efficiency can be enhanced whereby a manufacturing cost can be further suppressed.

(3) In the fin forming step S30, the width WG1 of the first groove 110, the width WR of the rib portion 140 and the width WG2 of the second groove 120 are relatively set such that the sum of the width WG1 of the first groove 110, the width WR of the rib portion 140 and the width WG2 of the second groove 120 is larger than the width WB of the blade 540 used in forming the ribs 20. By setting the relation between widths of the respective portions in this manner, the blade 540 can enter the inside of the first groove 110 and the second groove 120 and hence, the fin forming operation can be performed easily and efficiently.

3. Configuration and Advantageous Effects of Heat Sink 1 According to Embodiment 1

Next, the heat sink 1 according to the embodiment 1 is described.

FIG. 4 is a view for describing the heat sink 1 according to the embodiment 1. FIG. 4A is a perspective view of the heat sink 1, and FIG. 4B is a schematic view showing a mode where a back surface 14 of the heat sink 1 is viewed along an arrow P2 in FIG. 4A. FIG. 4C to FIG. 4E are views schematically showing one example of a mode where a cross section taken along a line B-B in FIG. 4A is observed. FIG. 4D and FIG. 4E are enlarged views of main parts where a range surrounded by a broken line C2 in FIG. 4C is enlarged by a microscope.

(1) The heat sink 1 according to the embodiment 1 is the heat sink 1 which is obtained in such a manner that the first groove 110 and the second groove 120 are formed on the front surface side FS of the substrate 100 having a flat plate shape and made of metal by a press, the rib portion 140 is formed in the region sandwiched between the first groove 110 and the second groove 120, the protruding ridge portions 150 formed on the back surface side RS of the substrate 100' are removed by cutting, the plurality of fins 20 are formed at the positions corresponding to the rib portion 140, and the portion 104 within a predetermined range is separated from the substrate 100' (also see FIGS. 2A-H and FIGS. 3A-F).

The plurality of fins 20 may be shaved and raised by skiving the rib portion 140. The heat sink 1 may be made of a copper material.

Such a heat sink is, as described in the column of the method of manufacturing a heat sink according to the above-mentioned embodiment 1, applicable to a heat sink made of a copper material. Since such a heat sink is a heat sink obtained by a simple method without using extrusion molding or cutting working and hence, a user can obtain a heat sink which is relatively inexpensive and exhibits high heat radiation efficiency.

(2) In other words (that is), the heat sink 1 according to the embodiment 1 can be also specified as follows.

The heat sink 1 according to the embodiment 1 is a heat sink made of metal (for example, a copper material), and the heat sink 1 includes, on the front surface side FS of the heat sink 1, the heat sink base portion 10 which is a base portion for the fins 20, and the plurality of fins 20 formed in a raised manner from a side of the heat sink base portion 10 (see FIG. 4A).

In such a configuration, the fins 20 are in a state where the fins 20 are directly raised from the heat sink base portion 10. However, the heat sink 1 according to the embodiment 1 is not limited to such a configuration.

Surface worked traces 160 are formed on the back surface 14 of the heat sink 1 by removing protruding portions by cutting and by adjusting cut surfaces (see FIG. 4B).

Assume a case where, prior to the observation of a cross section, the heat sink base portion 10 and the fins 20 are cut on a surface which is perpendicular to the back surface 14 of the heat sink 1 and is parallel to the width direction of the fins 20, and desired treatment such as polishing or etching is applied to a cut surface. By etching the cut surface, a trace which supports the presence of inclusions, for example, appears in the vicinity of a grain boundary due to a difference in an etching rate. Then, the cut surface is observed by a microscope such as a scanning electron microscope (SEM).

In this case, for example, as shown in FIG. 4D, a direction D2 of lines 18a relating to a metal structure right below an upper surface 11 of the heat sink base portion 10 (for example, the lines 18a observed due to elongation of inclusions in a metal material by a press) is approximately parallel to the upper surface 11 of the heat sink base portion 10. In FIG. 4D, a tangential direction of the upper surface 11 of the heat sink base portion 10 is indicated by D1.

A direction of lines 18b relating to a metal structure in the heat sink base portion 10 right below proximal ends 24 of the fins 20 (for example, D3) intersects with the direction D1 parallel to the upper surface 11 of the heat sink base portion 10, and the lines 18b relating to the metal structure converge toward an area in the vicinity of the proximal ends 24 of the fins 20.

(3) In other words, the heat sink 1 according to the embodiment 1 can be also specified as follows.

The heat sink 1 according to the embodiment 1 is a heat sink made of metal (for example, a copper material), and the heat sink 1 includes, on the front surface side FS of the heat sink 1, the heat sink base portion 10 which is a base portion for the fins 20, and the plurality of fins 20 formed in a raised manner from a side of the heat sink base portion 10 (see FIG. 4A).

The back surface 14 of the heat sink 1 has surface worked traces 160 which are formed by removing protruding portions by cutting and adjusting cut surfaces (see FIG. 4B).

In the same manner as the description made in the above (2), assume that the heat sink base portion 10 and the fins 20 are cut on a plane which is perpendicular to the back surface 14 of the heat sink 1 and is parallel to the width direction of the fins 20, and the cut surface is observed by a microscope.

In this case, an average particle size of a grain boundary 19a of a metal structure right below the upper surface 11 of the heat sink base portion 10 is smaller than an average particle size of a grain boundary 19b of a metal structure at a position disposed at a predetermined depth in the vicinity of the fin distal ends 22. In other words, a portion in the vicinity of the heat sink base portion 10 is compressed in a thickness direction. Accordingly, the heat sink 1 according to the embodiment 1 is a heat sink which is more robust and has high durability.

Embodiment 2

A method of manufacturing a heat sink according to the embodiment 2 is described.

Figure 5:
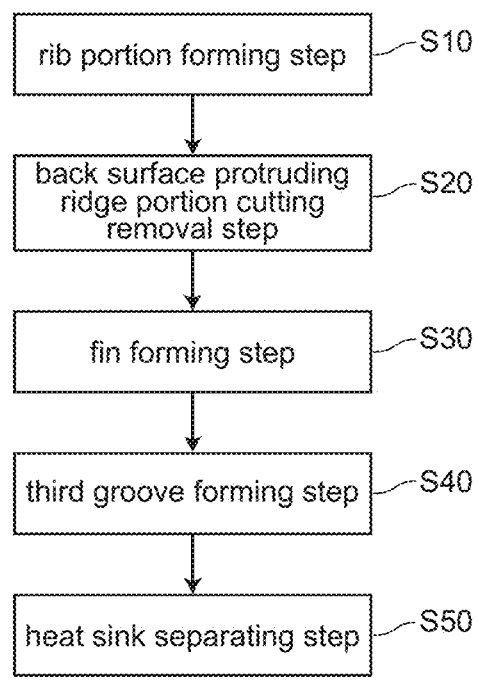
FIG. 5 is a flowchart for describing a method of manufacturing a heat sink according to an embodiment 2.
Figure 6A:
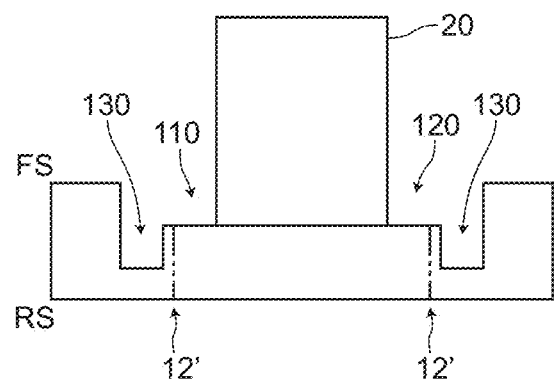
FIGS. 6A and 6B are views for describing main points of the method of manufacturing a heat sink according to the embodiment 2.
Figure 6B:
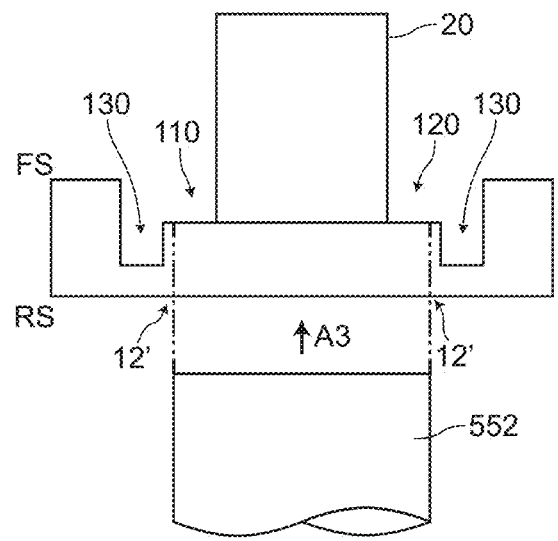

FIG. 5 is a flowchart for describing a method of manufacturing a heat sink according to the embodiment 2. FIG. 6 is a view for describing main points of the method of manufacturing a heat sink according to the embodiment 2. FIG. 6A is a front view or a cross-sectional view for describing a third groove forming step S40, and FIG. 6B is a front view or a cross-sectional view for describing a heat sink separating step S50 in FIG. 6B. In the embodiment 2, constitutional elements having basically identical configurations and technical features as the embodiment 1 are used by giving the same symbols as the embodiment 1, and the description of the constitutional elements is omitted.

The method of manufacturing a heat sink according to the embodiment 2 basically has the substantially equal configuration of the method of manufacturing a heat sink according to the embodiment 1. However, the method of manufacturing a heat sink according to the embodiment 2 differs from the method of manufacturing a heat sink according to the embodiment 1 with respect to a point that the method of manufacturing a heat sink according to the embodiment 2 further performs the third groove forming step S40 (see FIG. 5).

That is, as shown in FIG. 5, the method of manufacturing a heat sink according to the embodiment 2 further includes the third groove forming step S40 between a rib portion forming step S10 and a heat sink separating step S50. In the flowchart shown in FIG. 5, the third groove forming step S40 is performed after a fin forming step S30 is performed and before the heat sink separating step S50 is performed. However, the method of manufacturing a heat sink according to the embodiment 2 is not limited to such configuration. For example, the third groove forming step S40 may be performed between the rib portion forming step S10 and the back surface protruding ridge portion cutting removal step S20, or may be performed between the back surface protruding ridge portion cutting removal step S20 and the fin forming step S30.

In the third groove forming step S40, as shown in FIG. 6A, on a bottom surface of at least one groove out of a first groove 110 and a second groove 120, a third groove 130 is formed at a position outside a position 12' at which an end 12 of a heat sink base portion 10 is scheduled to be formed. The third groove 130 may be formed using any method. For example, the third groove 130 may be formed by cutting working.

According to the method of manufacturing a heat sink according to the embodiment 2, a portion disposed outside of the position 12' at which the end 12 of the heat sink base portion 10 is scheduled to be formed becomes thin. As a result, as shown in FIG. 6B, when the heat sink separating step S50 is performed by pressing (profile blanking) using a punch 552, a volume of a material which is drawn by pressing is decreased by an amount that the portion is made thin by forming the third groove 130 as describe above and hence, a resistance at the time of performing pressing can be reduced. Accordingly, the occurrence of sagging at the end 12 of the heat sink base portion 10 can be suppressed.

The method of manufacturing a heat sink according to the embodiment 2 has substantially the same configuration as the method of manufacturing a heat sink according to the embodiment 1 with respect to the configurations other than the point that the third groove forming step S40 is further performed. Accordingly, the method of manufacturing a heat sink according to the embodiment 2 acquires the corresponding advantageous effects found amongst all advantageous effects which the method of manufacturing a heat sink according to the embodiment 1 acquires.

[Modification]

Although the present invention has been described based on the above-mentioned embodiments, the present invention is not limited to the above-mentioned embodiments. Various modes can be carried out without departing from the gist of the present invention and, for example, the following modifications are also conceivable.

(1) In the above-mentioned respective embodiments, the number of constitutional elements, and materials, shapes, positions, sizes and the like of the constitutional elements are provided only for an exemplifying purpose, and can be changed within a range that advantageous effects of the present invention are not impaired.

(2) The structure of the fins 20 can adopt various modes within a range that advantageous effects of the present invention are not impaired. In the method of manufacturing a heat sink and the heat sink 1 according to the embodiment 1, the description has been made by taking the straight-shaped fin 20 where side surfaces (not indicated by a symbol) of the fin 20 extends in a straight-line shape perpendicular to the back surface 14 of the heat sink base portion 10, and a surface of the fin 20 which mainly works as a heat radiation area is a flat surface (see FIG. 4A and the like).

However, the present invention is not limited to such a configuration, and the fins can adopt a desired shape and the grooves (the first groove 110 and the second groove 120) can have shapes corresponding to the shape of the fin in conformity with a specification required by a client of heat sinks.

Figure 7A:
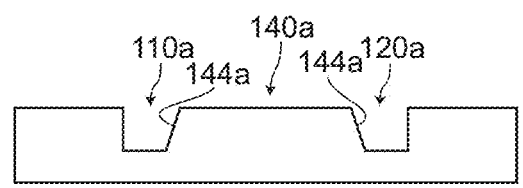
FIGS. 7A-C are views for describing a modification.

For example, the illustration and the description have been made with respect to the heat sink where the first groove 110 and the second groove 120 formed in the rib portion forming step S10 are formed as grooves having a simple rectangular shape, and a cross-sectional shape of the rib portion 140 is a simple rectangular shape. However, the present invention is not limited to such a configuration, for example, as shown in FIG. 7A, a trapezoidal rib portion 140a may be formed in a cross-sectional shape where side surfaces 144a of a rib portion are inclined. Alternatively, as shown in FIG. 7B, a rib portion 140b having a step-like cross-sectional shape may be formed.

Further, the illustration and the description have been made with respect to the example where each of the fins 20 formed in the fin forming step S30 is formed of a flat-plate-like straight fin. However, the present invention is not limited to such a configuration. For example, as shown in FIG. 7C, curled fins 20a may be formed. Further, fins 20 having other shapes such as a waveform or a pin shape not shown in the drawing may be formed.

Figure 7B:
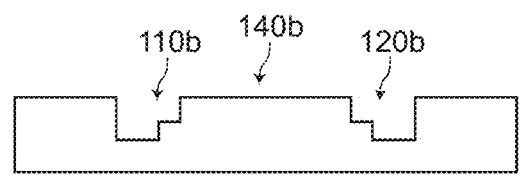
Figure 7C:
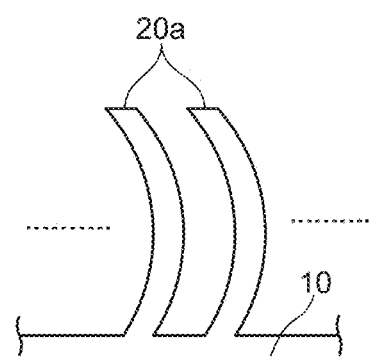

FIG. 7 is a view for describing modifications. FIG. 7A and FIG. 7B are a front view or a cross-sectional view corresponding to FIG. 2G and FIG. 2H. FIG. 7C is an enlarged view of a main part when the fin 20a according to the modification is viewed in a right side view. The basic constructions and technical features which are identical with the constitutional elements of the embodiment 1 and the embodiment 2 are indicated by the same symbols used in the embodiment 1 and the embodiment 2, and the description of these configurations and technical features is omitted.

(3) In the above-mentioned embodiment, as the back surface protruding ridge portion cutting removable step S20, the description has been made with respect to the example where the protruding ridge portions 150 are cut by the cutting tool 530 (for example, an end mill). However, the present invention is not limited to such an example, for example, the protruding ridge portions 150 may be removed by cutting by moving a punch in a direction parallel to the back surface 14 of the heat sink base portion 10 (press working). The back surface 14 of the heat sink base portion 10 forms a surface which is brought into contact with a heat generating part when the heat sink 1 is used as a product.

Accordingly, it is desirable to apply finishing working to the back surface 14 after press working so as to suppress roughness of the surface.

(4) In the above-mentioned embodiment, in the fin forming step S30, the fins 20 are formed by shaving and raising the rib portion 140 by skiving. However, the present invention is not limited to such a configuration. For example, the fins may be formed by cutting working. For example, a method may be adopted where a slit (or a louver) is formed between the fin and the fin by removing a part of the rib portion by cutting using a disk-shaped metal saw, for example. Even when the metal saw is used, the substrate 100' has the first groove 110 and the second groove 120 and hence, it is possible to move away a blade of the metal saw at the first groove 110 and the second groove 120. Accordingly, it is possible to perform working such that curved surfaces do not remain on roots of the slits of the finished fins 20 on a first groove 110 side/a second groove 120 side of the fins (the bottom of the slit forming a flat surface).

(5) In the above-mentioned embodiment, in the heat sink separating step S50, profile blanking (press forming) is performed. However, the present invention is not limited to such working. For example, it is possible to adopt a method where the heat sink 1 is cut away from the substrate 100' by machine working (cutting working).

(6) In the above-mentioned embodiment, the heat sink separating step S50 is performed after the fin forming step S30 is performed. However, the present invention is not limited to such a configuration. For example, provided that a state is obtained where the rib portion forming step S10 and the back surface protruding ridge portion cutting removal step S20 are finished, thereafter, a portion from which the heat sink is formed is obtained by separating the portion 104 within a predetermined range from the substrate 100' and, thereafter, the fin forming step S30 may be performed. The manufacturing method which is performed in accordance with such steps in this order may be treated equivalent to the method of manufacturing the heat sink according to the present invention.

What is claimed is:

1. A method of manufacturing a heat sink made of metal, the method comprising in a following order:
   a rib portion forming step of forming a rib portion on a substrate having a flat plate shape in such a manner that a first groove and a second groove are formed on a front surface side of the substrate by plastically deforming the substrate by a press thus forming the rib portion in a region sandwiched between the first groove and the second groove;
   a back surface protruding ridge portion cutting removal step of removing protruding ridge portions formed on a back surface side of the substrate by cutting;
   a fin forming step of forming a plurality of fins by working the rib portion; and
   a heat sink separating step of obtaining the heat sink by separating a portion within a predetermined range which includes the fins from the substrate.

2. The method of manufacturing a heat sink according to claim 1, wherein in the fin forming step, the fins are formed by shaving and raising the rib portion by skiving.

3. The method of manufacturing a heat sink according to claim 1, wherein a width of the first groove, a width of the rib portion and a width of the second groove are relatively set such that a sum of the width of the first groove, the width of the rib portion and the width of the second groove is larger than a width of a blade used in performing the working in the fin forming step.

4. The method of manufacturing a heat sink according to claim 1, further comprising a third groove forming step between the rib portion forming step and the heat sink separating step, and in the third groove forming step, a third groove is formed on a bottom surface of at least one groove out of the first groove and the second groove at a position outside a position at which an end of a heat sink base portion is scheduled to be formed.

\* \* \* \* \*